United States Patent
Yen et al.

(10) Patent No.: US 10,027,785 B2
(45) Date of Patent: Jul. 17, 2018

(54) METHOD FOR SWITCHING SCREEN STATE OF TERMINAL, TERMINAL THEREOF, AND COMPUTER-READABLE MEDIUM THEREOF

(71) Applicant: Beijing Xiaomi Mobile Software Co., Ltd., Haidian District, Beijing (CN)

(72) Inventors: Chiafu Yen, Beijing (CN); Peng Zhang, Beijing (CN); Penglong Hu, Beijing (CN); Dawei Xiong, Beijing (CN)

(73) Assignee: BEIJING XIAOMI MOBILE SOFTWARE CO., LTD., Haidian District, Beijing (CN)

( * ) Notice: Subject to any disclaimer, the term of this patent is extended or adjusted under 35 U.S.C. 154(b) by 0 days.

(21) Appl. No.: 15/629,765

(22) Filed: Jun. 22, 2017

(65) Prior Publication Data
US 2018/0007185 A1    Jan. 4, 2018

(30) Foreign Application Priority Data
Jun. 30, 2016  (CN) .......................... 2016 1 0513189

(51) Int. Cl.
*H04M 1/725* (2006.01)
*H04W 52/02* (2009.01)
(Continued)

(52) U.S. Cl.
CPC .............. *H04M 1/22* (2013.01); *G01S 7/539* (2013.01); *G01S 15/08* (2013.01); *G01S 15/34* (2013.01);
(Continued)

(58) Field of Classification Search
CPC .... H04M 1/22; H04M 1/026; H04M 1/72569; H04M 2250/12; H04M 1/72519;
(Continued)

(56) References Cited

U.S. PATENT DOCUMENTS

| 7,415,293 | B1 * | 8/2008 | Lee ..................... H04W 52/027 455/574 |
| 2009/0066533 | A1 * | 3/2009 | Park ...................... G06F 3/0346 340/4.37 |

(Continued)

FOREIGN PATENT DOCUMENTS

EP    2988479 A1    2/2016

OTHER PUBLICATIONS

Extended European Search Report for European Application No. 17177488.8, dated Nov. 3, 2017.

*Primary Examiner* — Andrew Wendell
(74) *Attorney, Agent, or Firm* — Jun He Law Offices P.C.; James J. Zhu

(57) ABSTRACT

A method for switching a screen state, a terminal, and computer-readable medium are provided. The method includes: transmitting a transmission sound wave when it is detected that the screen state of the terminal is in a light-on state during a voice communication session, the transmission sound wave being a sound wave of a pre-defined frequency; determining a target detection region when a target receiving sound wave is received through a plurality of pre-installed sound wave receiving devices, the target receiving sound wave being formed by reflecting the transmission sound wave by a target object; and switching the screen state of the terminal from the light-on state into a light-off state when it is determined that the target object is located in the target detection region.

14 Claims, 10 Drawing Sheets

(51) Int. Cl.
*H04B 17/23* (2015.01)
*H04M 1/22* (2006.01)
*G01S 15/08* (2006.01)
*G01S 7/539* (2006.01)
*G01S 15/34* (2006.01)
*G01S 15/42* (2006.01)
*G01S 15/46* (2006.01)
*H03K 17/945* (2006.01)
*H04M 1/02* (2006.01)
*G09G 5/10* (2006.01)

(52) U.S. Cl.
CPC .............. *G01S 15/42* (2013.01); *G01S 15/46* (2013.01); *H03K 17/945* (2013.01); *H04M 1/026* (2013.01); *H04M 1/72569* (2013.01); *G09G 5/10* (2013.01); *H04M 2250/12* (2013.01)

(58) Field of Classification Search
CPC ...... H04B 17/23; H04W 52/027; G01S 15/08; G01S 15/46; G01S 15/42; G01S 7/539; G01S 15/34; H03K 17/945; G09G 5/10
See application file for complete search history.

(56) References Cited

U.S. PATENT DOCUMENTS

| | | | |
|---|---|---|---|
| 2011/0122728 A1 | 5/2011 | Liao et al. | |
| 2012/0183099 A1* | 7/2012 | Harrat | G06F 1/3231 375/319 |
| 2015/0117160 A1* | 4/2015 | Sakurada | G01S 1/68 367/197 |
| 2015/0154849 A1* | 6/2015 | Matsui | G08B 21/22 342/28 |
| 2016/0345113 A1* | 11/2016 | Lee | G01S 15/04 |

\* cited by examiner

METHOD FOR SWITCHING SCREEN STATE OF TERMINAL, TERMINAL THEREOF, AND COMPUTER-READABLE MEDIUM THEREOF

CROSS-REFERENCE TO RELATED APPLICATION

This application is based on and claims priority to Chinese Patent Application No. 201610513189.3 filed on Jun. 30, 2016, which is incorporated herein by reference in its entirety.

FIELD

The present disclosure relates to communication field, and particularly to a method for switching a screen state of a terminal, a terminal and computer-readable medium.

BACKGROUND

A terminal may perform erroneous operations due to that a face of a user of the terminal gets close to the terminal when the user is communicating with an opposite terminal through the terminal. Typically, a distance sensor may be utilized to obtain a distance value between an object and the terminal. When the distance value is less than a pre-defined value, a screen of the terminal is controlled to switch into a light-off state automatically.

However, if the user's parts other than the face, are too close to the terminal during the communication, the terminal will make an erroneous judgment and control the screen of the terminal to switch into the light-off state.

SUMMARY

A method for switching a screen state of a terminal, a terminal thereof and computer-readable medium thereof are provided in the disclosure.

According to a first aspect of embodiments in the present disclosure, a method for switching a screen state of a terminal is provided, and the method includes: transmitting a transmission sound wave when it is detected that the screen state of the terminal is in a light-on state during a voice communication session, the transmission sound wave being a sound wave of a pre-defined frequency; determining a target detection region when a target receiving sound wave is received through a plurality of pre-installed sound wave receiving devices, the target receiving sound wave being formed by reflecting the transmission sound wave by a target object; and switching the screen state of the terminal from the light-on state into a light-off state when it is determined that the target object is located in the target detection region.

According to a second aspect of embodiments in the present disclosure, a terminal is provided, and the terminal includes a sound wave transmitting device and a plurality of sound wave receiving devices, a processor, and a memory to store processor-executable instructions. The processor is configured to: transmit, via the sound wave transmitting device, a transmission sound wave when it is detected that a screen state of the terminal is in a light-on state during a voice communication session, the transmission sound wave being a sound wave of a pre-defined frequency; determine a target detection region when a target receiving sound wave is received via the plurality of sound wave receiving devices, the target receiving sound wave being formed by reflecting the transmission sound wave by a target object; and switch the screen state of the terminal from the light-on state into a light-off state when it is determined that the target object is located in the target detection region.

According to a third aspect of embodiments in the present disclosure, there is provided a non-transitory computer-readable storage medium having stored therein instructions that, when executed by a processor of a terminal, causes the terminal to perform a method for switching a screen state of the terminal, and the method includes: transmitting a transmission sound wave when it is detected that the screen state of the terminal is in a light-on state during a voice communication session, the transmission sound wave being a sound wave of a pre-defined frequency; determining a target detection region when a target receiving sound wave is received through a plurality of pre-installed sound wave receiving devices, the target receiving sound wave being formed by reflecting the transmission sound wave by a target object; and switching the screen state of the terminal from the light-on state into a light-off state when it is determined that the target object is located in the target detection region.

It is to be understood that both the forgoing general description and the following detailed description are exemplary only, and are not restrictive of the present disclosure.

BRIEF DESCRIPTION OF THE DRAWINGS

The accompanying drawings, which are incorporated in and constitute a part of this specification, illustrate embodiments consistent with the disclosure and, together with the description, serve to explain the principles of the disclosure.

DETAILED DESCRIPTION

Reference will now be made in detail to exemplary embodiments, examples of which are illustrated in the accompanying drawings. The following description refers to the accompanying drawings in which same numbers in different drawings represent same or similar elements unless otherwise described. The implementations set forth in the following description of exemplary embodiments do not represent all implementations consistent with the disclosure. Instead, they are merely examples consistent with aspects related to the disclosure as recited in the appended claims.

The terms used in this disclosure are merely for the purpose of describing particular embodiments, and are not intended to restrict the present disclosure. The words "a", "the" and "that" used in a singular form in this disclosure and the appended claims are intended to include the plural forms as well, unless the context clearly indicates other meanings. It is also to be understood that, the term "and/or" used herein refers to include any or all possible combinations of one or more of the associated listed items.

It is to be understood that, although the terms "first", "second", "third", etc. may be used in this disclosure to describe various information, such information should not be limited to these terms. These terms are only used to distinguish the same type of information from each other. For example, the first information may also be referred to as second information, and similarly, the second information may also be referred to as first information, without departing from the scope of the disclosure. Depending on the context, the word "if" as used herein may be construed as "upon", "when", or "responsive to a determination that".

Figure 1:
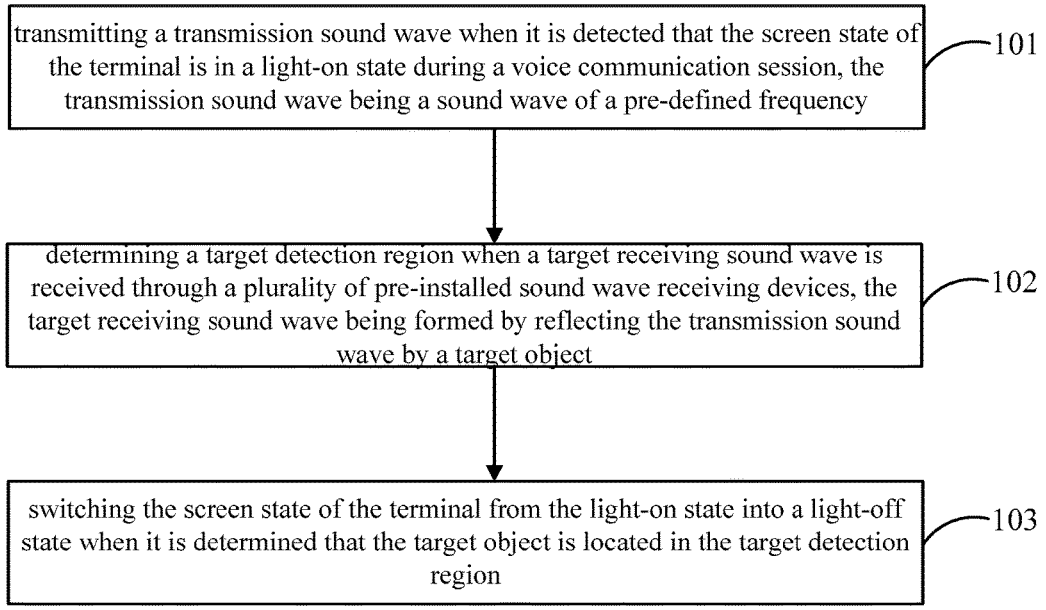
FIG. 1 is a flow chart illustrating a method for switching a screen state according to an exemplary embodiment of the present disclosure.

A method for switching a screen state provided by an embodiment of the present disclosure may be used in a terminal, such as a smart phone, a tablet, a Personal Digital Assistant (PDA) and the like. FIG. 1 illustrates a method for switching a screen state of a terminal according to an exemplary embodiment, and the method may include the following steps.

In step 101, a transmission sound wave may be transmitted when it is detected that the screen state of the terminal is in a light-on state during a voice communication session, and the transmission sound wave is a sound wave of a pre-defined frequency.

In this step, the sound wave may be transmitted by the terminal through a pre-installed sound wave transmitting device. Alternatively, the sound wave transmitting device may be a handset. In order not to affect a normal progress of the communication, the sound wave may be a sound that is not heard by the human ear, such as an ultrasonic wave with a frequency higher than 20 kilohertzs (KHZ), or an infrasound wave with a frequency less than 20 Hz. Furthermore, given that the infrasound wave is harmful to humans, therefore, the sound wave may be the ultrasonic wave with a frequency higher than 20 KHZ.

In step 102, a target detection region may be determined when a target receiving sound wave is received through a plurality of pre-installed sound wave receiving devices, and the target receiving sound wave is formed by reflecting the transmission sound wave by a target object.

Figure 2:
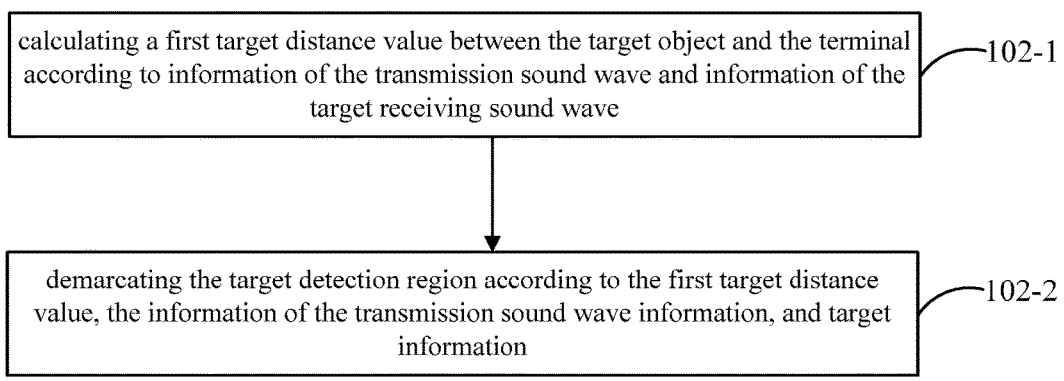
FIG. 2 is a flow chart illustrating another method for switching a screen state according to an exemplary embodiment of the present disclosure.

FIG. 2 illustrates another method for switching a screen state of a terminal based on the foregoing embodiment shown in the FIG. 1, and the step 102 may include the following steps.

In step 102-1, a first target distance value between the target object and the terminal may be calculated according to information of the transmission sound wave and information of the target receiving sound wave.

Wherein the information of the transmission sound wave may be information of the sound wave transmitted by a sound wave transmitting device. The information of the target receiving sound wave may be information of the sound wave reflected by the target object and received by a target sound wave receiving device of the plurality of sound wave receiving devices.

Figure 3A:
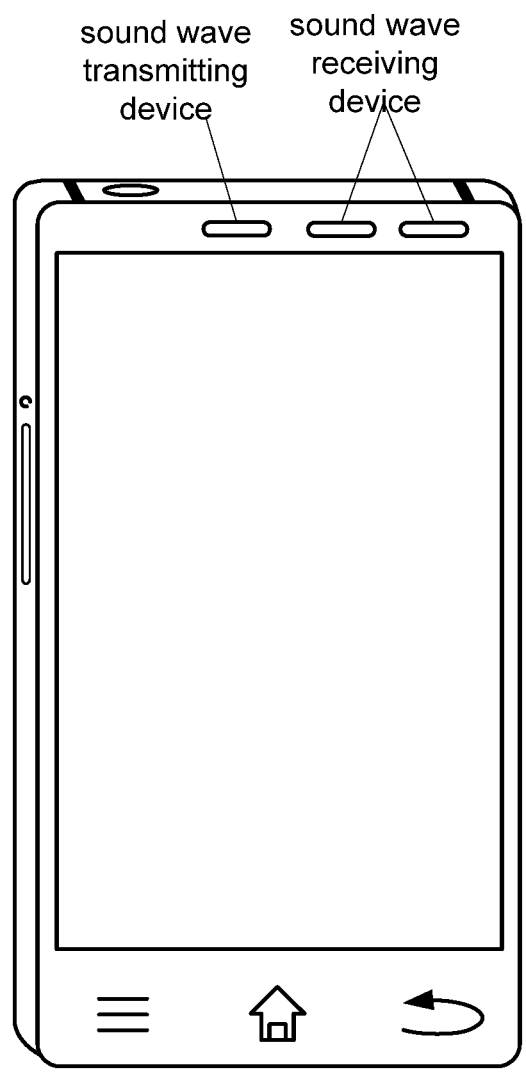
FIG. 3A to 3B are schematic diagrams illustrating a scene for switching a screen state according to an exemplary embodiment of the present disclosure.

In the embodiment of the present disclosure, as shown in FIG. 3A, a plurality of sound wave receiving devices may be pre-installed on the terminal, and the plurality of sound wave receiving devices may be disposed around the sound wave transmitting device. A distance between the sound wave receiving devices and the sound wave transmitting device may be adjusted according to the size of the internal hardware space of the terminal. For example, the sound wave receiving devices may be a speaker.

Figure 3B:
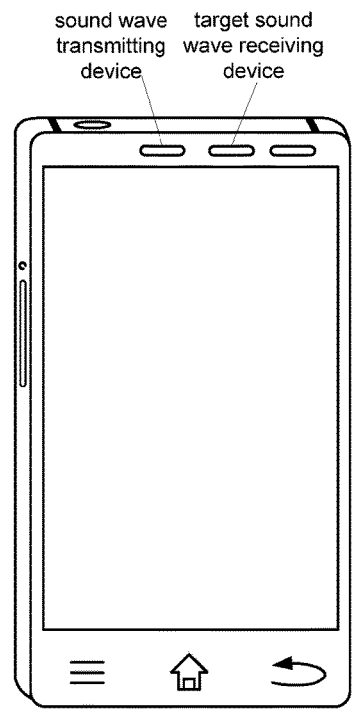

The target sound wave receiving device may be any one of the plurality of sound wave receiving devices. For example, it may be the one closest to the sound wave transmitting device, as shown in FIG. 3B.

In some embodiments, in calculating the first target distance value between the target object and the terminal according to the information of the transmission sound wave and the information of the target receiving sound wave, the following ways may be adopted.

In some embodiments, the first target distance value may be calculated based on a time difference between transmitting and receiving the sound wave, and a propagation speed value of the sound wave.

Figure 4A:
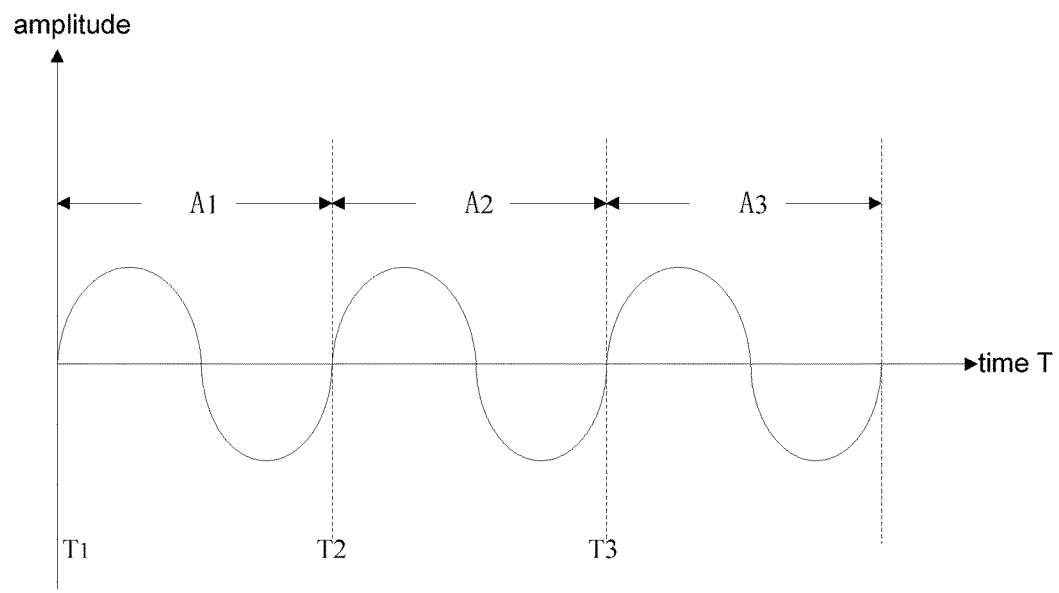
FIG. 4A to 4B are schematic diagrams illustrating a scene for switching a screen state according to an exemplary embodiment of the present disclosure.

In this way, each data frame may be numbered and a transmission time point at which each frame of data is transmitted may be recorded, when the sound wave is transmitted by the sound wave transmitting device. For example, each data frame may be numbered in turn by the sound wave transmitting device as $A_1, A_2, \ldots, A_n$, and the transmission time point may be $T_1, T_2, \ldots, T_n$, as shown in FIG. 4A.

Figure 4B:
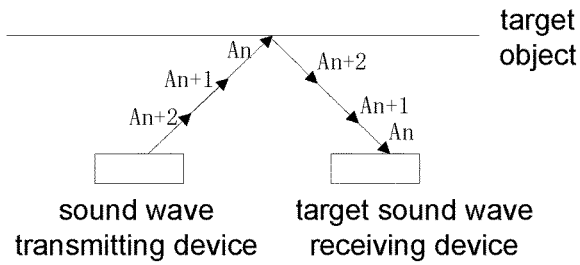

When reaching a target object, the sound wave will be reflected back and received by the target sound wave receiving device, as shown in FIG. 4B. The target sound wave receiving device may record a reception time point at which each data frame is received, the reception time point may be $T_1', T_2', \ldots, T_n'$ in turn.

In the embodiments of the present disclosure, the first target distance value may be calculated according to a target data frame in the sound wave, such as transmission time point of a data frame numbered $A_n$, a reception time point of the target data frame is received by the target sound wave receiving device and a propagation speed value of the sound wave.

In some embodiments, the first target distance value d may be calculated according to the formulas as follows:

$$d = \frac{(T'_n - T_n) \times V}{2},$$

wherein, the $T_n'$ is a reception time point at which a data frame numbered $A_n$ is received by the target sound wave receiving device, the $T_n$ is a transmission time point at which the data frame numbered $A_n$ is transmitted by the sound wave transmitting device, and V is the propagation speed value of the sound wave.

Alternatively, the first target distance value may be calculated according to an energy attenuation ratio value of the sound wave.

Typically, the sound wave energy per unit area decreases with the square of the distance from the sound source. As a propagation distance of a sound wave increases in a medium, the amplitude of the sound wave will gradually decrease and the average sound energy density will decrease gradually as well.

In present disclosure, it is assumed that the amplitude of the sound wave transmitted by the sound wave transmitting device is A centimeter (cm), when the target object is infinitely distant from the sound wave transmitting devices, the energy of the sound wave received by the target sound wave receiving device may be considered to be almost attenuated to zero, and accordingly, the amplitude of the sound wave may be 0 cm. When the target object is infinitely close to the sound wave transmitting device, the energy of the sound wave received by the target sound wave receiving device may be considered to be almost unbated, and accordingly, the amplitude of the sound wave may be A cm. Therefore, it could be seen that the variation of the amplitude value of the sound wave received by the target sound wave receiving device is inversely proportional to the variation of the first target distance value. When the received amplitude value of the sound wave is becoming smaller and smaller, the distance between the terminal and the target object is farther and farther.

Figure 5:
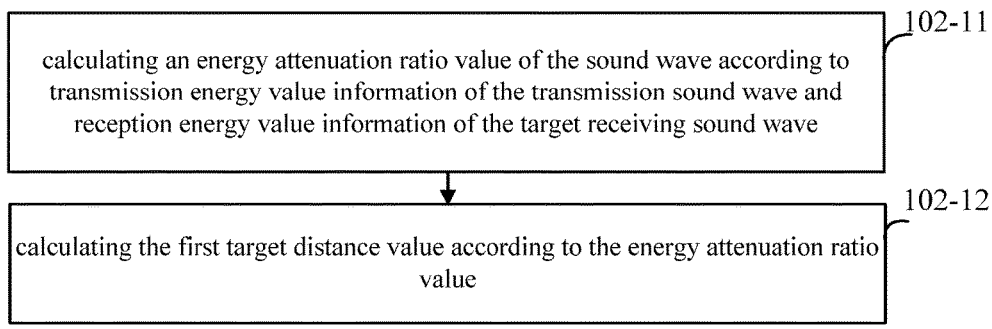
FIG. 5 is a flow chart illustrating another method for switching a screen state according to an exemplary embodiment of the present disclosure.

FIG. 5 illustrates another method for switching a screen state of a terminal based on the foregoing embodiment shown in the FIG. 2, and the step 102-1 may include the following steps.

In step 102-11, an energy attenuation ratio value of the sound wave may be calculated according to transmission energy value information of the transmission sound wave, and reception energy value information of the target receiving sound wave.

In this step, the transmission energy value information and the reception energy value information may be both measured with the variation of the amplitude value of each data frame of the sound. It is assumed that an initial amplitude value of the sound wave transmitted by the sound wave transmitting device is A cm, and when the sound wave reflected by the target object is received by the target sound wave receiving device, it is assumed that the current amplitude value of the sound wave received according to the related arts is B cm, wherein A>B.

The energy attenuation ratio value k=B/A×100%.

In step 102-12, the first target distance value may be calculated according to the energy attenuation ratio value.

In this step, the first target distance value d may be calculated according to the prior art, because the energy attenuation ratio value is inversely proportional to the first target distance value.

In step 102-2, the target detection region may be demarcated according to the first target distance value, the information of the transmission sound wave, and target information.

Wherein the target information includes location information for characterizing respective locations of the plurality of sound wave receiving devices and pre-defined direction information for characterizing respective pre-defined direction ranges for receiving sound waves of the plurality of sound wave receiving devices.

Figure 6:
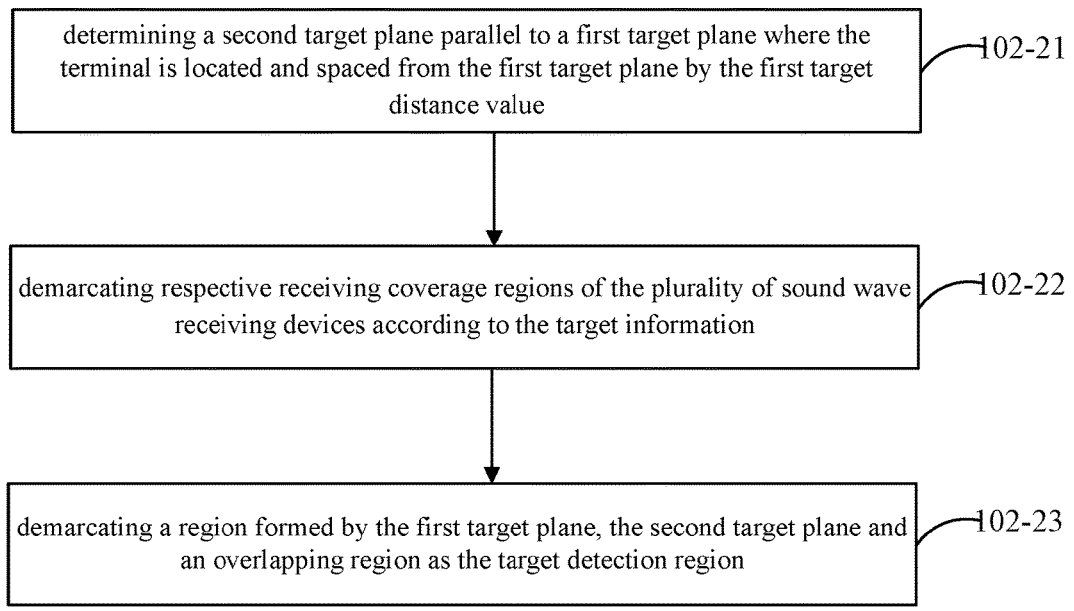
FIG. 6 is a flow chart illustrating another method for switching a screen state according to an exemplary embodiment of the present disclosure.

FIG. 6 illustrates another method for switching a screen state of a terminal based on the foregoing embodiment shown in the FIG. 2, the step 102-2 may include the following steps.

In step 102-21, a second target plane may be determined, and the second target plane is parallel to a first target plane where the terminal is located and spaced from the first target plane by the first target distance value.

In this step, a plane where the terminal is located may be the first target plane. Furthermore, based on the first target distance value calculated in the steps above, the second target plane which is parallel to the first target plane and spaced from the first target plane by the first target distance value may be determined according to the related arts, as shown in FIG. 7A.

In step 102-22, respective receiving coverage regions of the plurality of sound wave receiving devices may be demarcated according to the target information.

Wherein the target information may be fixed after the plurality of sound wave receiving devices have been installed. In this step, the respective receiving coverage regions of the plurality of sound wave receiving devices may be demarcated respectively according to the target information.

Figure 7A:
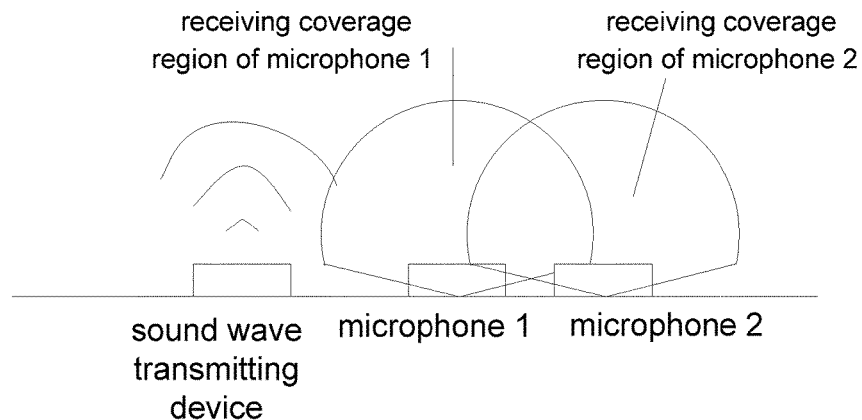
FIG. 7A to 7C are schematic diagrams illustrating a scene for switching a screen state according to an exemplary embodiment of the present disclosure.

For example, as shown in FIG. 7A, two sound wave receiving devices are pre-installed on the terminal, namely, a microphone 1 and a microphone 2. The location of the microphone 1 and the microphone2 may be determined according to the location information in the target information. And the respective receiving coverage regions including the pre-defined direction ranges for receiving sound waves may be demarcated on the respective location of microphone 1 and the microphone2, according to the direction information in the target information, as shown in FIG. 7A.

Figure 7B:
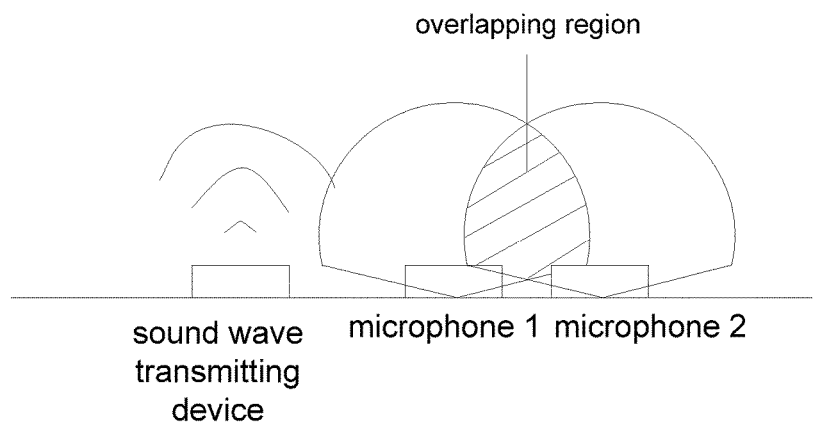
Figure 7C:
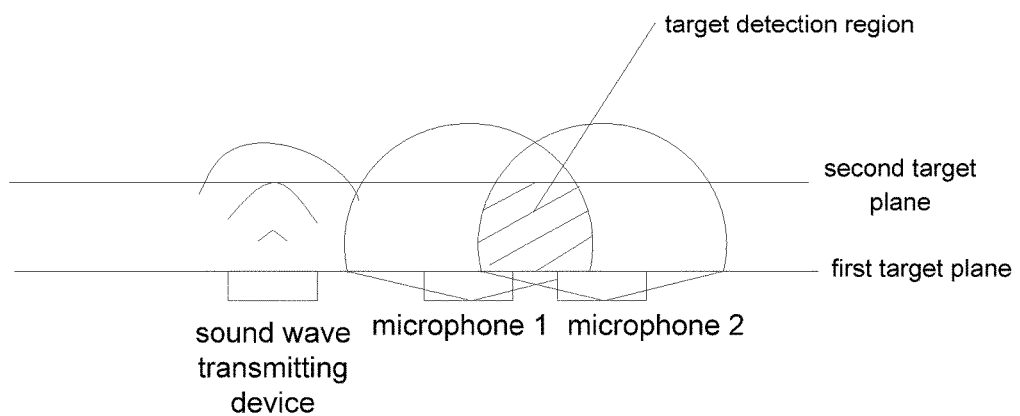

In step 102-23, a region formed by the first target plane, the second target plane and an overlapping region may be demarcated as the target detection region.

Wherein the overlapping region may be a region overlapping between the receiving coverage regions, such as the shaded part in FIG. 7B.

The region formed by the first target plane, the second target plane and the overlapping region, such as the shaded part in FIG. 7B, may be the target detection region.

In step 103, the screen may be controlled to switch into a light-off state when it is determined that the target object is located in the target detection region.

Figure 8:
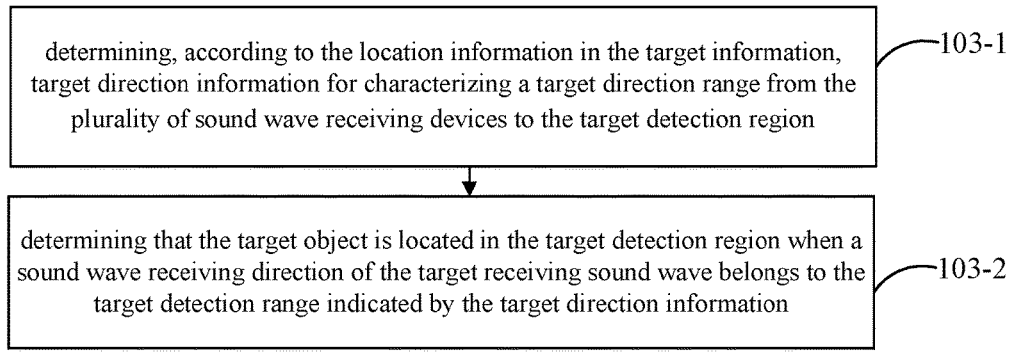
FIG. 8 is a flow chart illustrating another method for switching a screen state according to an exemplary embodiment of the present disclosure.

In this step, alternatively, as shown in FIG. 8, which illustrates another method for switching a screen state of a terminal based on the foregoing embodiment shown in the FIG. 8, detecting whether the target object is located in the target detection region may include the follows steps:

In step 103-1, target direction information for characterizing a target direction range directed from the plurality of sound wave receiving devices to the target detection range may be determined according to the location information in the target information.

In this step, the plurality of sound wave receiving devices may determine the target direction information from their own location according to the related arts.

Figure 9A:
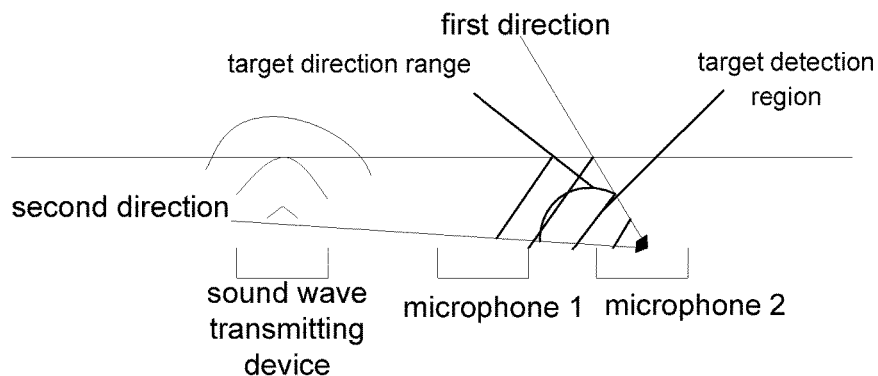
FIG. 9A to 9B are schematic diagrams illustrating a scene for switching a screen state according to an exemplary embodiment of the present disclosure.

As shown in FIG. 9A, the target direction range including a direction range from a first direction to a second direction indicated by the target direction information may be determined by the microphone 2. In step 103-2, the target object may be determined to be located in the target detection region when a sound wave receiving direction of the sound wave reflected by the target object and received by the plurality of sound wave receiving devices belongs to the target detection range indicated by the target direction information.

In this step, when the sound wave reflected by the target object is received by the plurality of sound wave receiving devices, the sound wave receiving direction of the received sound wave may be determined according to the related arts, and thus to determine whether the sound wave receiving direction belongs to the target direction range. If it does, the target object may be determined to be located in the target detection region.

Figure 9B:
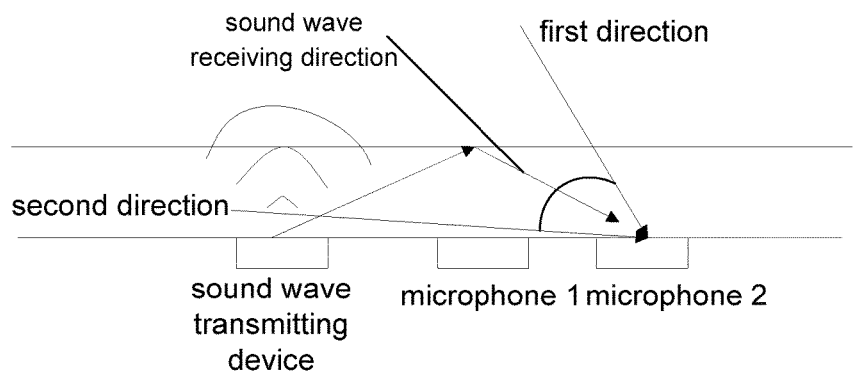

As shown in FIG. 9B, the target object may be determined to be located in the target detection region when the sound wave receiving direction received by the microphone 2 belongs to the target direction range.

In the embodiment of the present disclosure, when it is determined that the target object is located in the target detection region by the terminal, the screen may be controlled to switch into a light-off state according to the related arts. Of course, at this time, the target object may need to be close enough to the terminal, namely, the first target distance value may need to be less than the pre-defined value.

In the embodiment above, the terminal may transmit automatically a sound wave of a pre-defined frequency when it is detected that a screen of a terminal is in a light-on state during the communication with an opposite terminal through the terminal. Furthermore, a target detection region may be determined when the sound wave reflected by a target object is received through a plurality of pre-installed sound wave receiving devices. The screen may be controlled to switch into a light-off state automatically when it is determined that the target object is located in the target detection region. In the embodiment of the present disclosure, the target detection region may be determined based on the sound wave received by the plurality of sound wave receiving devices, and the screen may be switched into the light-off state only when the target object is located in the target detection region. It reduces the possibility that the terminal makes an erroneous judgement due to the user's other parts, except for the face, get too close to the terminal, and it improves the intelligent degree of the terminal, resulting in a good user experience.

Corresponding to the method embodiments described above, the apparatus embodiments are also provided by the present disclosure.

Figure 10:
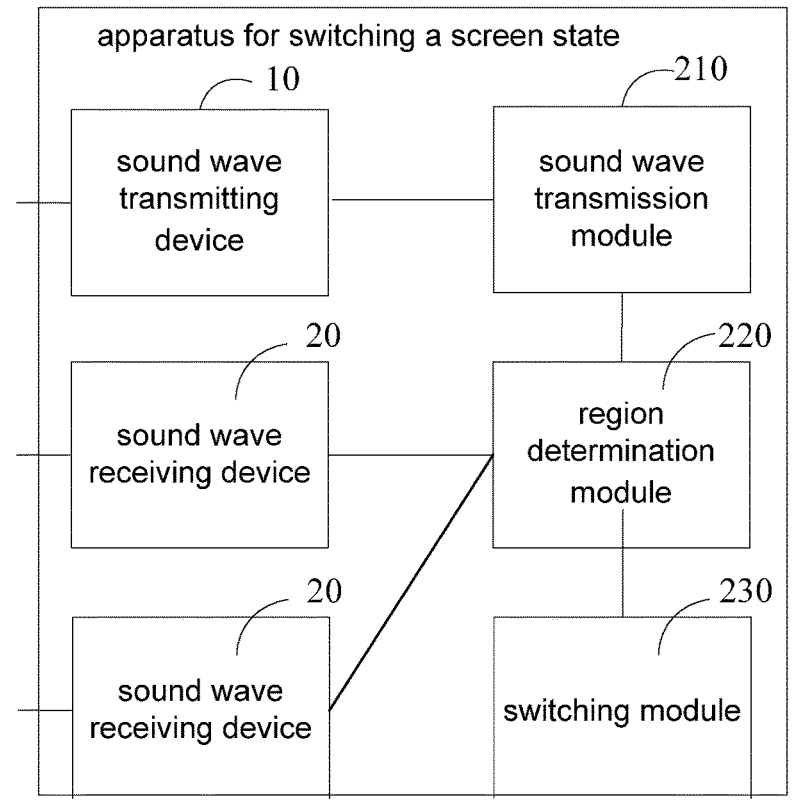
FIG. 10 is a block diagram illustrating an apparatus for switching a screen state according to an exemplary embodiment of the present disclosure.

FIG. 10 is a block diagram illustrating an apparatus for switching a screen state of a terminal according to an exemplary embodiment of the present disclosure. The apparatus may include a sound wave transmitting device 10 and a plurality of sound wave receiving devices 20. The apparatus may further include: a sound wave transmission module 210 configured to transmit a transmission sound wave when it is detected that a screen state of the terminal is in a light-on state during a voice communication session, the transmission sound wave is a sound wave of a pre-defined frequency; a region determination module 220 configured to determine a target detection region when a target receiving sound wave is received via the plurality of sound wave receiving devices, and the target receiving sound wave is formed by reflecting the transmission sound wave by a target object; and a switching module 230 configured to switch the screen state of the terminal from the light-on state into a light-off state when it is determined that the target object is located in the target detection region.

Figure 11:
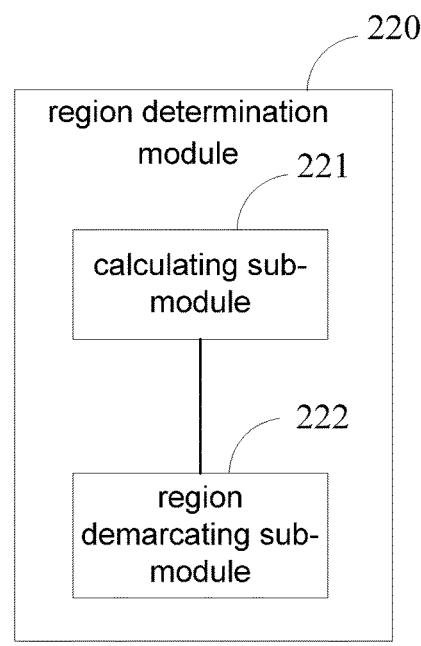
FIG. 11 is a block diagram illustrating another apparatus for switching a screen state according to an exemplary embodiment of the present disclosure.

FIG. 11 is a block diagram illustrating another apparatus for switching a screen state of a terminal according to an exemplary embodiment of the present disclosure. The embodiment is based on the above-mentioned embodiment in FIG. 10. The region determination module 220 may include: a calculating sub-module 221 configured to calculate a first target distance value between the target object and the terminal according to information of transmission sound wave and target receiving sound wave information, wherein the information of the transmission sound wave may be information of the sound wave transmitted by the sound wave transmitting device, and the information of the target receiving sound wave may be information of the sound wave reflected by the target object and received by a target sound wave receiving device of the plurality of sound wave receiving devices; and a region demarcating sub-module 222 configured to demarcate the target detection region according to the first target distance value, the information of the transmission sound wave, and target information, wherein the target information may include location information for characterizing respective locations of the plurality of sound wave receiving devices and pre-defined direction information for characterizing respective pre-defined direction ranges for receiving sound waves of the plurality of sound wave receiving devices.

Figure 12:
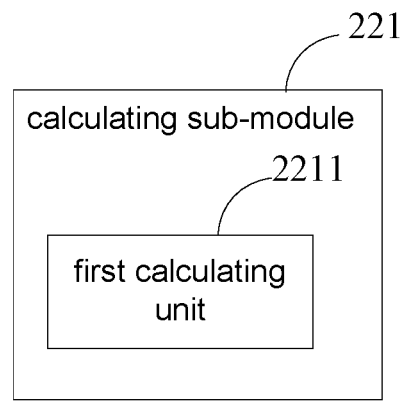
FIG. 12 is a block diagram illustrating another apparatus for switching a screen state according to an exemplary embodiment of the present disclosure.

FIG. 12 is a block diagram illustrating another apparatus for switching a screen state of a terminal according to an exemplary embodiment of the present disclosure. The embodiment is based on the above-mentioned embodiment in FIG. 11. The calculating sub-module 221 may include: a first calculating unit 2211 configured to calculate the first target distance value according to transmission time point information of a target data frame in the transmission sound wave, reception time point information of the target data frame in the target receiving sound wave, and a speed value of the sound wave.

Figure 13:
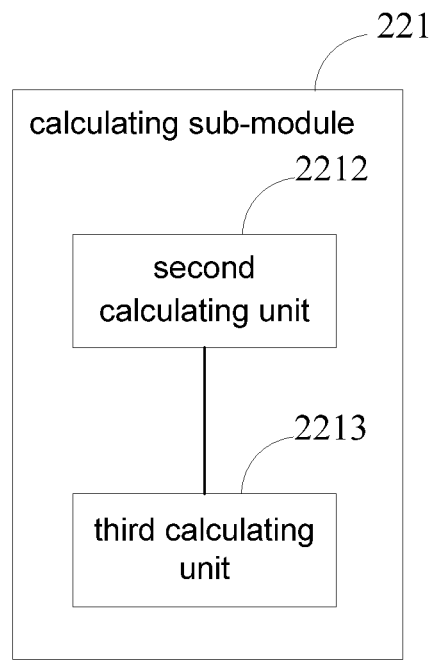
FIG. 13 is a block diagram illustrating another apparatus for switching a screen state according to an exemplary embodiment of the present disclosure.

FIG. 13 is a block diagram illustrating another apparatus for switching a screen state of a terminal according to an exemplary embodiment of the present disclosure. The embodiment is based on the above-mentioned embodiment in FIG. 11. The calculating sub-module 221 may include: a second calculating unit 2212 configured to calculate an energy attenuation ratio value of the sound wave according to transmission energy value information of the transmission sound wave, and reception energy value information of the target receiving sound wave; and a third calculating unit 2213 configured to calculate the first target distance value according to the energy attenuation ratio value.

Figure 14:
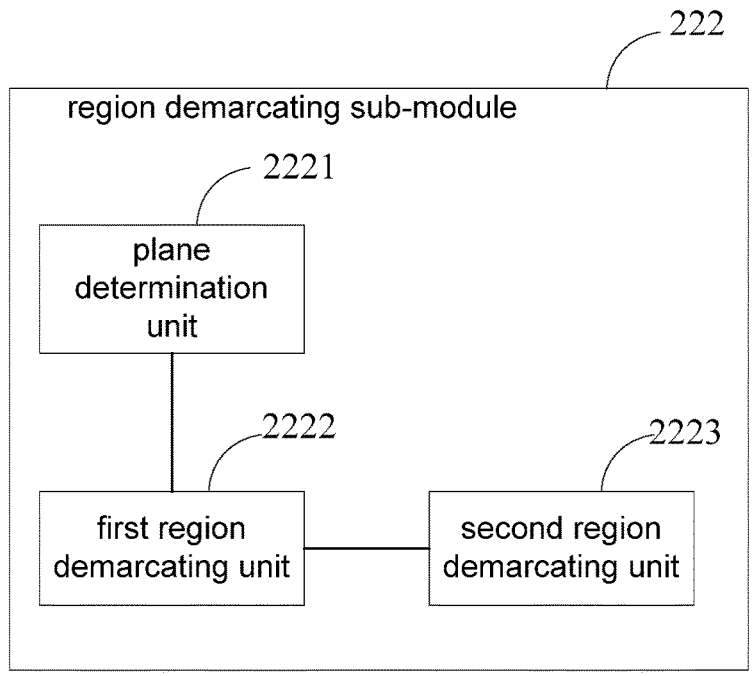
FIG. 14 is a block diagram illustrating another apparatus for switching a screen state according to an exemplary embodiment of the present disclosure.

FIG. 14 is a block diagram illustrating another apparatus for switching a screen state of a terminal according to an exemplary embodiment of the present disclosure. The embodiment is based on the above-mentioned embodiment in FIG. 11. The region demarcating sub-module 222 may include: a plane determination unit 2221 configured to determine a second target plane, which is parallel to a first target plane where the terminal is located and spaced from the first target plane by the first target distance value; a first region demarcating unit 2222 configured to demarcate respective receiving coverage regions of the plurality of sound wave receiving devices according to the target information; and a second region demarcating unit 2223 configured to demarcate a region formed by the first target plane, the second target plane and a overlapping region as the target detection region. The overlapping region may be a region overlapping between the receiving coverage regions.

Figure 15:
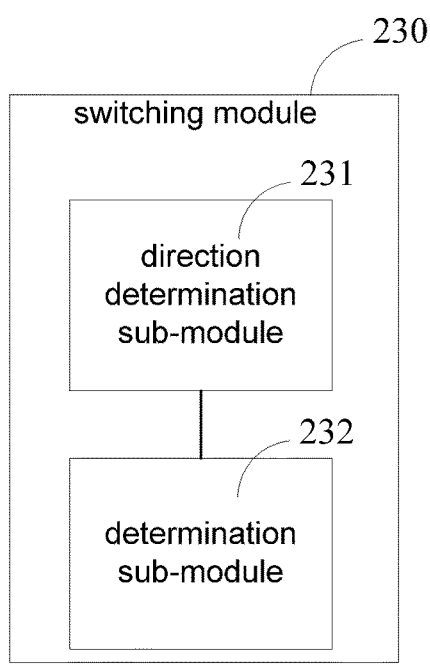
FIG. 15 is a block diagram illustrating another apparatus for switching a screen state according to an exemplary embodiment of the present disclosure.

FIG. 15 is a block diagram illustrating another apparatus for switching a screen state of a terminal according to an exemplary embodiment of the present disclosure. The embodiment is based on the above-mentioned embodiment in FIG. 14. The switching module 230 may include: a direction determination sub-module 231 configured to determine target direction information for characterizing a target direction range directed from the plurality of sound wave receiving devices to the target detection region according to the location information in the target information; and a determination sub-module 232 configured to determine that the target object is located in the target detection region when a sound wave receiving direction of the sound wave reflected by the target object and received by the plurality of sound wave receiving devices belongs to the target detection range indicated by the target direction information.

For an apparatus embodiment, since it substantially corresponds to a method embodiment, relevant aspects are with reference to a part of the description of the method embodiment. The apparatus embodiment described above are merely illustrative, wherein an unit illustrated as a separate component may or may not be physically separated, namely, may be located in the same place, or may be distributed to a plurality of network units. Parts or all of the modules may be selected to achieve the implementation of the present disclosure according to practical needs. It may be understood and implemented by an ordinary skill in the art without creative work.

Accordingly, a terminal may be provided by the present disclosure. The terminal may include a sound wave transmitting device and a plurality of sound wave receiving devices. The terminal may further include: a processor; and a memory to store processor-executable instructions; wherein, the processor is configured to: transmit, via the sound wave transmitting device, a transmission sound wave when it is detected that a screen state of the terminal is in a light-on state during a voice communication session, the transmission sound wave being a sound wave of a predefined frequency; determine a target detection region when a target receiving sound wave is received via the plurality of sound wave receiving devices, the target receiving sound wave being formed by reflecting the transmission sound wave by a target object; and switch the screen state of the terminal from the light-on state into a light-off state when it is determined that the target object is located in the target detection region.

Figure 16:
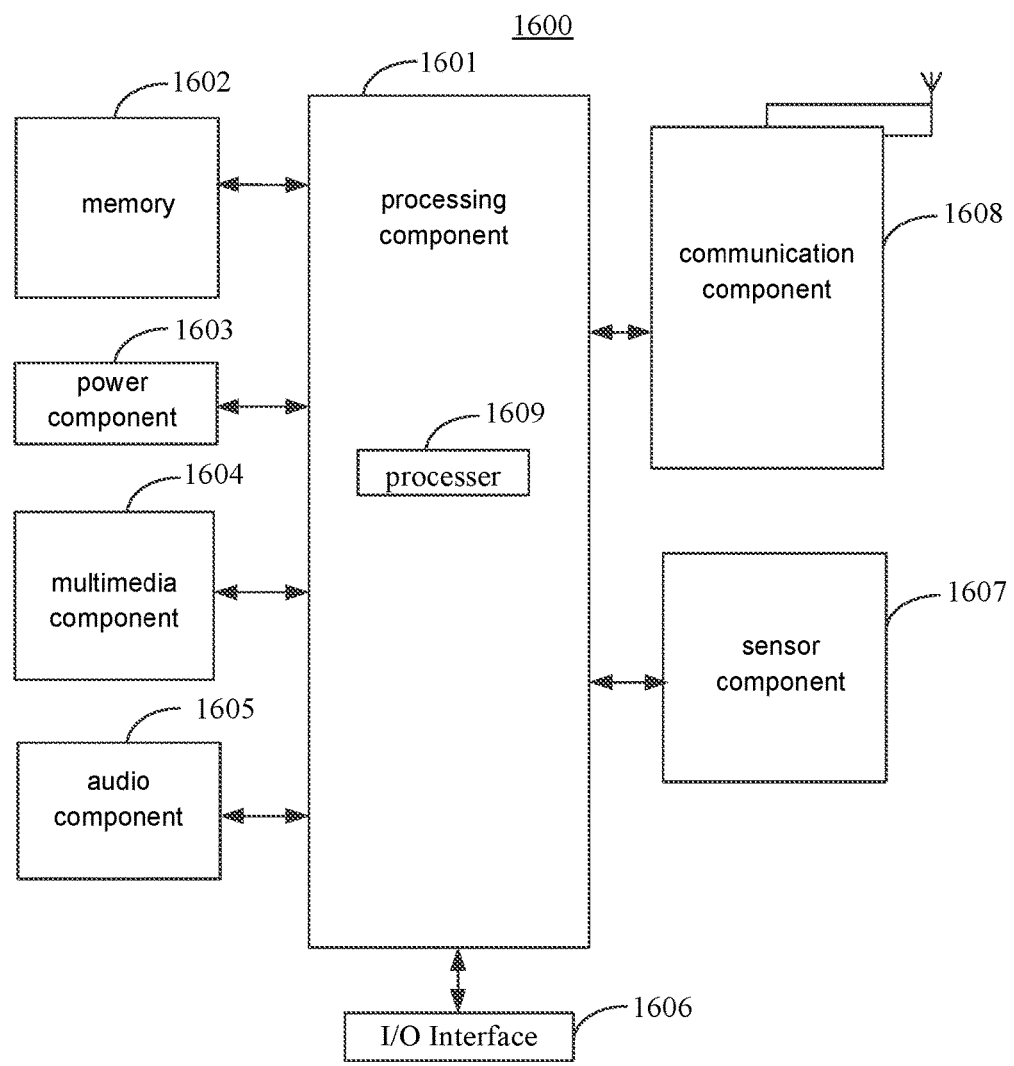
FIG. 16 is a schematic structural diagram illustrating an apparatus for switching a screen state according to an exemplary embodiment of the present disclosure.

FIG. 16 is a schematic structural diagram illustrating an apparatus for switching a screen state according to an exemplary embodiment of the present disclosure. As shown in FIG. 16, an apparatus for switching a screen state 1600 illustrated according to one exemplary embodiment may be a terminal, such as a computer, a mobile phone, a digital broadcasting terminal, a messaging device, a game console, a tablet device, a medical device, fitness equipment, a personal digital assistant and the like.

Referring to FIG. 16, the apparatus 1600 may include one or more of the following components: a processing component 1601, a memory 1602, a power component 1603, a multimedia component 1604, an audio component 1605, an input/output (I/O) interface 1606, a sensor component 1607, and a communication component 1608.

The processing component 1601 typically controls overall operations of the apparatus 1600, such as the operations associated with display, telephone calls, data communications, camera operations, and recording operations. The processing component 1601 may include one or more processors 1609 to execute instructions to perform all or part of the steps in the above described methods. Moreover, the processing component 1601 may include one or more modules which facilitate the interaction between the processing component 1601 and other components. For instance, the processing component 1601 may include a multimedia module to facilitate the interaction between the multimedia component 1604 and the processing component 1601.

The memory 1602 is configured to store various types of data to support the operation of the apparatus 1600. Examples of such data include instructions for any applications or methods operated on the apparatus 1600, contact data, phonebook data, messages, pictures, video, etc. The memory 1602 may be implemented using any type of volatile or non-volatile storage devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The power component 1603 provides power to various components of the apparatus 1600. The power component 1603 may include a power management system, one or more power sources, and any other components associated with the generation, management, and distribution of power for the apparatus 1600.

The multimedia component 1604 includes a screen providing an output interface between the apparatus 1600 and the user. In some embodiments, the screen may include a liquid crystal display (LCD) and a touch panel (TP). If the screen includes the touch panel, the screen may be implemented as a touch screen to receive input signals from the user. The touch panel includes one or more touch sensors to sense touches, swipes, and gestures on the touch panel. The touch sensors may not only sense a boundary of a touch or swipe action, but also sense a period of time and a pressure associated with the touch or swipe action. In some embodiments, the multimedia component 1604 includes a front camera and/or a rear camera. The front camera and the rear camera may receive an external multimedia datum while the apparatus 1600 is in an operation mode, such as a photographing mode or a video mode. Each of the front camera and the rear camera may be a fixed optical lens system or have optical focusing and zooming capability.

The audio component 1605 is configured to output and/or input audio signals. For example, the audio component 1605 includes a microphone ("MIC") configured to receive an external audio signal when the apparatus 1600 is in an operation mode, such as a call mode, a recording mode, and a voice recognition mode. The received audio signal may be further stored in the memory 1602 or transmitted via the communication component 1608. In some embodiments, the audio component 1605 further includes a speaker to output audio signals.

The I/O interface 1602 provides an interface between the processing component 1601 and peripheral interface modules, the peripheral interface modules being, for example, a keyboard, a click wheel, buttons, and the like. The buttons may include, but are not limited to, a home button, a volume button, a starting button, and a locking button.

The sensor component 1607 includes one or more sensors to provide status assessments of various aspects of the apparatus 1600. For instance, the sensor component 1607 may detect an open/closed status of the apparatus 1600, relative positioning of components (e.g., the display and the keypad, of the apparatus 1600), and the sensor component 1607 may further detect a change in position of the apparatus 1600 or a component of the apparatus 1600, a presence or absence of user contact with the apparatus 1600, an orientation or an acceleration/deceleration of the apparatus 1600, and a change in temperature of the apparatus 1600. The sensor component 1607 may include a proximity sensor configured to detect the presence of a nearby object without any physical contact. The sensor component 1607 may further include a light sensor, such as a CMOS or CCD image sensor, for use in imaging applications. In some embodiments, the sensor component 1607 may further include an accelerometer sensor, a gyroscope sensor, a magnetic sensor, a pressure sensor, or a temperature sensor.

The communication component 1608 is configured to facilitate communication, wired or wirelessly, between the apparatus 1600 and other devices. The apparatus 1600 may access a wireless network based on a communication standard, such as Wi-Fi, 2G, or 3G, or a combination thereof. In an exemplary embodiment, the communication component 1608 receives a broadcast signal or broadcast associated information from an external broadcast management system via a broadcast channel. In an exemplary embodiment, the communication component 1608 further includes a near field communication (NFC) module to facilitate short-range communications. For example, the NFC module may be implemented based on a radio frequency identification (RFID) technology, an infrared data association (IrDA) technology, an ultra-wideband (UWB) technology, a Bluetooth (BT) technology, and other technologies.

In exemplary embodiments, the apparatus 1600 may be implemented in one or more application specific integrated circuits (ASICs), digital signal processors (DSPs), digital signal processing devices (DSPDs), programmable logic devices (PLDs), field programmable gate arrays (FPGAs), controllers, micro-controllers, microprocessors, or other electronic elements, to perform the methods above.

In an exemplary embodiment, a non-transitory computer readable storage medium, including instructions, is also provided, such as the memory 1602 including instructions, and the instructions mentioned above may be performed by the processor 1609 of the apparatus 1600 to implement the method mentioned above. For example, the non-transitory computer readable storage medium may be a ROM, a random-access memory (RAM), a CD-ROM, a magnetic tape, a floppy disc, an optical data storage device, and the like.

Wherein, when the instructions in the storage medium are executed by the processor, the apparatus 1600 is enabled to perform the above method for switching a screen state.

Other embodiments of the disclosure will be apparent to those skilled in the art from consideration of the specification and practice of the disclosures herein. This application is intended to cover any variations, uses, or adaptations of the disclosure following the general principles thereof and including common sense or customary technical means in the art that is not disclosed in the disclosure. It is intended that the specification and examples be considered as exemplary only, with a true scope and spirit of the disclosure being indicated by the following claims.

The description above is merely the preferred embodiments of the present disclosure, and is not intended to restrict the present disclosure, and any modifications, equivalent substitutions, improvements and the like within the spirit and principles of the present disclosure are intended to be within the scope of the present disclosure.

What is claimed is:

1. A method for switching a screen state of a terminal, the method comprising:
   transmitting, by the terminal, a transmission sound wave when it is detected that the screen state of the terminal is in a light-on state during a voice communication session, the transmission sound wave being a sound wave of a pre-defined frequency;
   determining, by the terminal, a target detection region when a target receiving sound wave is received through a plurality of pre-installed sound wave receiving devices, the target receiving sound wave being formed by reflecting the transmission sound wave by a target object; and
   switching, by the terminal, the screen state of the terminal from the light-on state into a light-off state when it is determined that the target object is located in the target detection region.

2. The method of claim 1, wherein the terminal comprises:
   a sound wave transmitting device configured to transmit the transmission sound wave.

3. The method of claim 2, wherein determining, by the terminal, a target detection region comprises:
   calculating, by the terminal, a first target distance value between the target object and the terminal according to information of the transmission sound wave and information of the target receiving sound wave; and
   demarcating, by the terminal, the target detection region according to the first target distance value, the information of the transmission sound wave, and target information, the target information including location information for characterizing respective locations of the plurality of sound wave receiving devices and pre-defined direction information for characterizing respective pre-defined direction ranges for receiving sound waves of the plurality of sound wave receiving devices.

4. The method of claim 3, wherein calculating, by the terminal, the first target distance value between the target object and the terminal according to the information of the transmission sound wave and the information of the target receiving sound wave, comprises:
   calculating, by the terminal, the first target distance value according to transmission time point information of a target data frame in the transmission sound wave, reception time point information of the target data frame in the target receiving sound wave, and a speed value of the sound wave.

5. The method of claim 3, wherein calculating, by the terminal, the first target distance value between the target object and the terminal according to the information of the transmission sound wave and the information of the target receiving sound wave, comprises:
   calculating, by the terminal, an energy attenuation ratio value of the sound wave according to transmission energy value information of the transmission sound wave and reception energy value information of the target receiving sound wave; and
   calculating, by the terminal, the first target distance value according to the energy attenuation ratio value.

6. The method of claim 3, wherein demarcating, by the terminal, the target detection region according to the first target distance value, the information of the transmission sound wave, and target information, comprises:
determining, by the terminal, a second target plane parallel to a first target plane where the terminal is located and spaced from the first target plane by the first target distance value;
demarcating, by the terminal, respective receiving coverage regions of the plurality of sound wave receiving devices according to the target information; and
demarcating, by the terminal, a region formed by the first target plane, the second target plane and an overlapping region as the target detection region, the overlapping region being a region overlapping between the receiving coverage regions.

7. The method of claim 6, wherein switching, by the terminal, the screen state of the terminal from the light-on state into a light-off state when it is determined that the target object is located in the target detection region comprises:
determining, by the terminal, according to the location information in the target information, target direction information for characterizing a target direction range from the plurality of sound wave receiving devices to the target detection region; and
determining, by the terminal, that the target object is located in the target detection region when a sound wave receiving direction of the target receiving sound wave belongs to the target detection range indicated by the target direction information.

8. A terminal, comprising:
a sound wave transmitting device;
a plurality of sound wave receiving devices comprising a target sound wave receiving device;
a memory to store processor-executable instructions;
a processor configured to:
transmit, via the sound wave transmitting device, a transmission sound wave when it is detected that a screen state of the terminal is in a light-on state during a voice communication session, the transmission sound wave being a sound wave of a pre-defined frequency;
determine a target detection region when a target receiving sound wave is received via the plurality of sound wave receiving devices, the target receiving sound wave being formed by reflecting the transmission sound wave by a target object; and
switch the screen state of the terminal from the light-on state into a light-off state when it is determined that the target object is located in the target detection region.

9. The terminal of claim 8, wherein the processor configured to determine the target detection region is further configured to:
calculate a first target distance value between the target object and the terminal according to information of the transmission sound wave and information of the target receiving sound wave; and
demarcate the target detection region according to the first target distance value, the information of the transmission sound wave, and target information, the target information including location information for characterizing respective locations of the plurality of sound wave receiving devices and pre-defined direction information for characterizing respective pre-defined direction ranges for receiving sound waves of the plurality of sound wave receiving devices.

10. The terminal of claim 9, wherein the processor configured to calculate the first target distance value between the target object and the terminal according to the information of the transmission sound wave and the information of the target receiving sound wave is further configured to:
calculate the first target distance value according to transmission time point information of a target data frame in the transmission sound wave, reception time point information of the target data frame in the target receiving sound wave, and a speed value of the sound wave.

11. The terminal of claim 9, wherein the processor configured to calculate the first target distance value between the target object and the terminal according to the information of the transmission sound wave and the information of the target receiving sound wave is further configured to:
calculate an energy attenuation ratio value of the sound wave according to transmission energy value information of the transmission sound wave and reception energy value information of the target receiving sound wave; and
calculate the first target distance value according to the energy attenuation ratio value.

12. The terminal of claim 9, wherein the processor configured to demarcate the target detection region according to the first target distance value, the information of the transmission sound wave, and target information is further configured to:
determine a second target plane parallel to a first target plane where the terminal is located and spaced from the first target plane by the first target distance value;
demarcate respective receiving coverage regions of the plurality of sound wave receiving devices according to the target information; and
demarcate a region formed by the first target plane, the second target plane and a overlapping region as the target detection region, the overlapping region being a region overlapping between the receiving coverage regions.

13. The terminal of claim 9, wherein the processor configured to switch the screen state of the terminal from the light-on state into the light-off state when it is determined that the target object is located in the target detection region is further configured to:
determine, according to the location information in the target information, target direction information for characterizing a target direction range from the plurality of sound wave receiving devices to the target detection region; and
determine that the target object is located in the target detection region when a sound wave receiving direction of the target receiving sound wave belongs to the target detection range indicated by the target direction information.

14. A non-transitory computer-readable storage medium having stored therein instructions that, when executed by a processor of a terminal, causes the terminal to perform a method for switching a screen state of the terminal, the method comprising:
transmitting a transmission sound wave when it is detected that the screen state of the terminal is in a light-on state during a voice communication session, the transmission sound wave being a sound wave of a pre-defined frequency;
determining a target detection region when a target receiving sound wave is received through a plurality of pre-installed sound wave receiving devices, the target receiving sound wave being formed by reflecting the transmission sound wave by a target object; and switching the screen state of the terminal from the light-on state into a light-off state when it is determined that the target object is located in the target detection region.

\* \* \* \* \*